US008054359B2

(12) United States Patent
Seol et al.

(10) Patent No.: US 8,054,359 B2

(45) Date of Patent: Nov. 8, 2011

(54) IMAGE SENSOR WITH SENSING TRANSISTOR HAVING TWO GATES AND METHOD OF OPERATING THE SAME

(75) Inventors: Kwang-soo Seol, Suwon-si (KR); Sung-il Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 471 days.

(21) Appl. No.: 12/222,506

(22) Filed: Aug. 11, 2008

(65) Prior Publication Data

US 2009/0256941 A1 Oct. 15, 2009

(30) Foreign Application Priority Data

Apr. 11, 2008 (KR) ........................ 10-2008-0033881

(51) Int. Cl.
*H04N 3/14* (2006.01)
*H01L 31/062* (2006.01)

(52) U.S. Cl. ........................................ 348/308; 257/290

(58) Field of Classification Search .................. 348/291, 348/294, 302, 308; 257/290–292
See application file for complete search history.

(56) References Cited

U.S. PATENT DOCUMENTS

| | | | | |
|---|---|---|---|---|
| 6,493,030 | B1 * | 12/2002 | Kozlowski et al. | 348/310 |
| 6,720,592 | B1 * | 4/2004 | Kindt et al. | 257/231 |
| 6,850,278 | B1 * | 2/2005 | Sakurai et al. | 348/302 |
| 7,719,583 | B1 * | 5/2010 | Lee et al. | 348/294 |
| 7,724,295 | B2 * | 5/2010 | Kobayashi et al. | 348/308 |
| 7,777,169 | B2 * | 8/2010 | Hong | 250/208.1 |
| 7,800,675 | B2 * | 9/2010 | Shah | 348/308 |
| 7,830,439 | B2 * | 11/2010 | Kishi | 348/308 |
| 2006/0001061 | A1 * | 1/2006 | Miyatake et al. | 257/292 |

* cited by examiner

*Primary Examiner* — Trung Diep

(74) *Attorney, Agent, or Firm* — Harness, Dickey & Pierce, P.L.C.

(57) ABSTRACT

Provided is an image sensor including a sensing transistor having two gates and a method of operating the image sensor. The image sensor may include a photoelectric conversion device, a sensing transistor which may have a first gate connected to a floating diffusion region in which charges generated from the photoelectric conversion region are stored and a second gate separated from the first gate, a reset transistor that may be connected to the floating diffusion region and may reset a potential of the floating diffusion region, a control voltage source that may supply a control applied to the second gate, and a column output line which may be connected to a source of the sensing transistor.

9 Claims, 5 Drawing Sheets

IMAGE SENSOR WITH SENSING TRANSISTOR HAVING TWO GATES AND METHOD OF OPERATING THE SAME

FOREIGN PRIORITY STATEMENT

This application claims priority under 35 U.S.C. §119 to Korean Patent Application No. 10-2008-0033881, filed on Apr. 11, 2008, in the Korean Intellectual Property Office (KIPO), the entire contents of which are incorporated herein by reference.

BACKGROUND

1. Field

Example embodiments relate to an image sensor which may include a sensing transistor having two gates and a method of operating the same, and more particularly, to an image sensor which may include a sensing transistor having two gates, wherein the image sensor may measure light intensity incident to a pixel by turning on the sensing transistor by applying a voltage to an additional gate when the sensing transistor is not turned on due to the strong light incident to the pixel, and a method of operating the same.

2. Description of the Related Art

An image sensor may be a photoelectric conversion device that may transform detected light into electrical signals. A conventional image sensor may include a plurality of unit pixels arranged in an array on a semiconductor substrate. Each of the unit pixels may include a photodiode and a plurality of transistors. The photodiode may generate optical charges in response to detected external light, and the transistors may output electrical signals according to the amount of the produced optical charges.

A complimentary metal oxide semiconductor (CMOS) image sensor may include a control device that may control and process optical signals. The control device may be manufactured using a CMOS manufacturing technique. The CMOS image sensor may have a simple manufacturing process, and a signal process device may be manufactured in a single chip together with a photodiode.

Studies have been conducted to increase a dynamic range of a CMOS image sensor. In particular, in an image sensor, when a light is incident to the image sensor, a potential of a floating diffusion region connected to a gate of a sensing transistor may be reduced, and a gate voltage may be reduced lower than a threshold voltage, thus a sensing voltage may not be detected, and thus, an optical intensity may not be acquired. In order to measure an optical intensity of a sensing transistor with a gate voltage below a threshold voltage, a logarithmic circuit may be used. In this case, however, the number of transistors may be increased and the linearity of the logarithmic circuit may be low. Thus, it may be difficult to correctly measure the optical intensity of strong light.

Therefore, there may be a need to develop a CMOS image sensor having a wide dynamic range to measure the optical intensity of strong light.

SUMMARY

Example embodiments may provide an image sensor which may include a sensing transistor having two gates and may address the above and/or other problems.

Example embodiments may also provide a method of operating the image sensor which may include a sensing transistor having two gates.

Example embodiments may be provide an image sensor comprising: a photoelectric conversion device; a sensing transistor which may have a first gate connected to a floating diffusion region in which charges generated from the photoelectric conversion device are stored and a second gate separated from the first gate; a reset transistor that may be connected to the floating diffusion region and may reset a potential of the floating diffusion region; a control voltage source that may supply a control voltage to the second gate; and a column output line that may be connected to a source of the sensing transistor.

The image sensor may further comprise a row selection transistor that may include a drain connected to a source of the sensing transistor and a source connected to the column output line, and may select a row comprising the sensing transistor among a pixel array. The image sensor may further comprise a transfer transistor that may be formed between the floating diffusion region and the photoelectric conversion device to transfer charges generated from the photoelectric conversion device to the floating diffusion region.

The drain of the sensing transistor may be connected to an external input voltage.

The first gate and the second gate may be spaced apart on a transistor channel.

A portion of the first gate may be coupled with a portion of the second gate interposing a dielectric layer between the first and second gates.

The first gate and the second gate may be disposed on both sides of the transistor channel to face each other, or may be vertically disposed.

Example embodiments may provide a method of operating the image sensor which may include a sensing transistor having two gates. The method may comprise: resetting a potential of the floating diffusion region; irradiating light onto the photoelectric conversion device; determining the first voltage supplied to the second gate when the sensing transistor is turned on while gradually increasing a voltage being applied to the second gate; calculating the first gate voltage; and calculating the intensity of light irradiated onto the photoelectric conversion device from the value of the first gate voltage.

The calculating of the first gate voltage may comprise obtaining the first gate voltage according to the first voltage by referring to a look-up table which may be prepared in advance.

The determining of the first voltage may comprise determining the sensing transistor is turned on when a column current measured from the column output line is greater than a reference current.

Example embodiments may provide a method of operating an image sensor which may include a sensing transistor having two gates. The method may comprise: resetting a potential of the floating diffusion region; irradiating light onto the photoelectric conversion device; applying a second voltage to the second gate; determining whether the sensing transistor is turned on or not; measuring a third voltage supplied to the second gate when the sensing transistor is turned on by gradually increasing a voltage being applied to the second gate when the sensing transistor is not turned on; calculating the first gate voltage; and calculating the intensity of light irradiated onto the photoelectric conversion device from the first gate voltage.

The determining whether the sensing transistor is turned on or not may comprise determining whether an output current measured from the column output line is greater than a reference current or not, and if the output current is greater than the reference current, calculating the first gate voltage using the output current.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
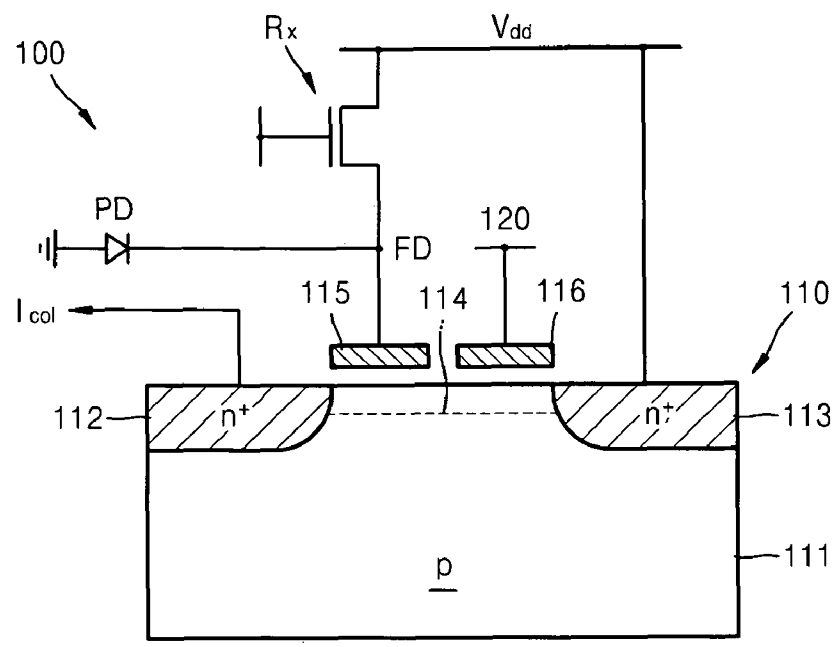
FIG. 1 is a schematic cross-sectional view of an image sensor including a sensing transistor having two gates, according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a schematic cross-sectional view of an image sensor 100 which may include a sensing transistor having two gates according to example embodiments.

Referring to FIG. 1, the image sensor 100 may include a photodiode PD, which may be a photoelectric conversion device, a reset transistor $R_x$, and a sensing transistor 110.

The sensing transistor 110 may include a source 112 and a drain 113, which may be separated from each other on a p-type semiconductor substrate 111 and may be doped with an n-type dopant. A transistor channel 114 may be formed between the source 112 and the drain 113. A dielectric layer (not shown) may be formed on the transistor channel 114. A first gate 115 and a second gate 116 may be formed spaced apart from each other on the dielectric layer. A floating diffusion region FD may be connected to the first gate 115 and a control voltage source 120 may be connected to the second gate 116. An external voltage $V_{dd}$ may be connected to the drain 113 and a column output line 130 which will be described later may be connected to the source 112.

Figure 2:
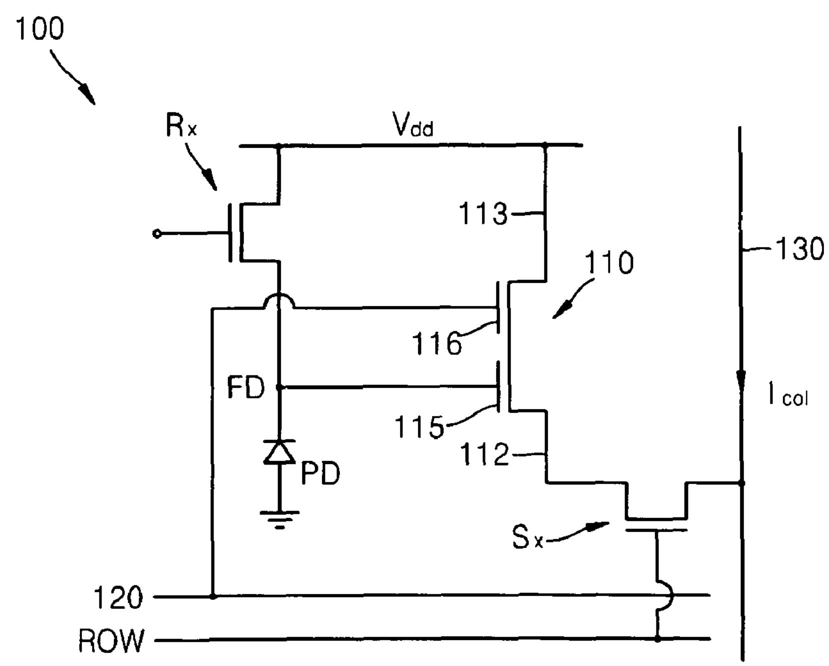
FIG. 2 is an equivalent circuit diagram of the image sensor of FIG. 1 according to example embodiments.

FIG. 2 is an equivalent circuit diagram of the image sensor 100 of FIG. 1. Like reference numerals may be used to indicate elements substantially identical to the elements of FIG. 1.

Referring to FIGS. 1 and 2, the image sensor 100 may further include a row selection transistor $S_x$. A drain of the row selection transistor $S_x$ may be connected to the source 112 of the sensing transistor 110, and a source of the row selection transistor $S_x$ may be connected to the column output line 130.

An operating principle of the image sensor 100 will now be described with reference to FIGS. 1 and 2.

First, a potential of the floating diffusion region FD may be reset to the external voltage $V_{dd}$ by turning the reset transistor $R_x$.

When light is irradiated onto the photodiode PD, electron-hole pairs may be formed in the photodiode PD, and electrons of the electron-hole pairs may move to the floating diffusion region FD. As the amount of charges accumulated in the floating diffusion region FD increases, a voltage of the first gate 115 connected to the floating diffusion region FD may be reduced.

Thus, if the light incident to the photodiode PD is strong, the first gate voltage may be reduced lower than a threshold voltage of the sensing transistor 110, and thus, the sensing transistor 110 may not be turned on. Thus, even though the row selection transistor $S_x$ is turned on, a current $I_{col}$ may not be detected from the column output line 130, and accordingly, it may not be possible to measure the intensity of light.

Figure 3:
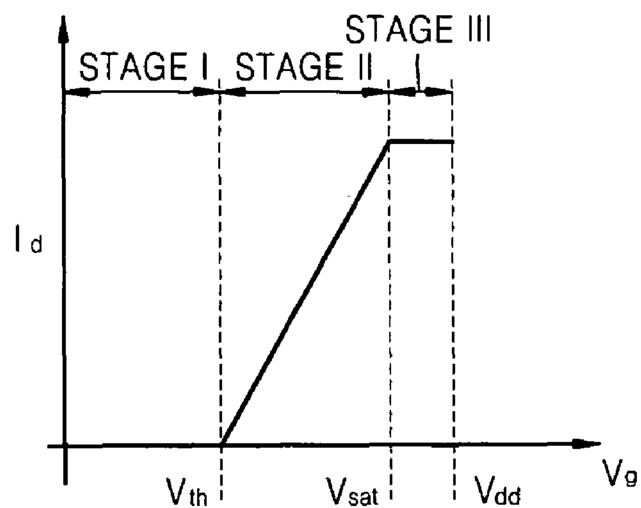
FIG. 3 is a graph showing a V-I curve of a conventional sensing transistor.

FIG. 3 shows an example of a $V_g$-$I_d$ curve of a conventional sensing transistor.

Referring to the example depicted in FIG. 3, in stage I in which a gate voltage $V_g$ is lower than the threshold voltage $V_{th}$, no drain current $I_d$ may be measured. Also, in stage III in which the gate voltage $V_g$ increases greater than a saturation voltage $V_{sat}$, the variation of a drain current $I_d$ may be very small although the gate voltage $V_g$ approaches the external voltage $V_{dd}$ since there may be nearly no light incident on the photodiode PD.

In stage II, the gate voltage $V_g$ may have a linear relationship with the drain current $I_d$. According to example embodiments, if a threshold voltage of the sensing transistor 110 is applied to the second gate 116, the characteristic of a drain current $I_d$ according to the voltage of the first gate 115 may follow the graph of FIG. 3.

As FIG. 3 illustrates, if the first gate voltage $V_g$ is in the stage II, the intensity of light may be determined from the measured drain current $I_d$. However, in the stage I in which the first gate voltage $V_g$ is lower than the threshold voltage $V_{th}$, the drain current $I_d$ may not be measured correctly, and thus, the intensity of light may not be correctly determined.

Figure 4:
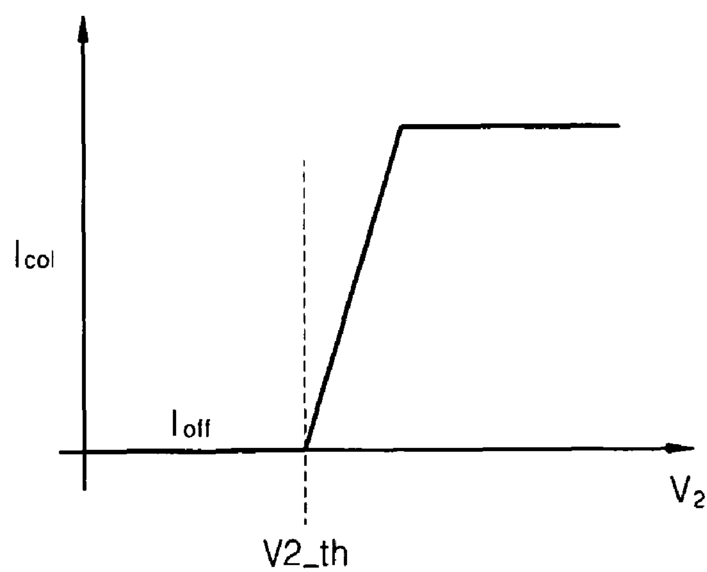
FIG. 4 is a graph showing a current outputted from a column output line according to a second gate voltage.

FIG. 4 is a graph showing the change of current $I_{col}$ outputted from a column output line 130 according to a voltage of the second gate voltage $V_2$.

Referring to FIG. 4, in a state in which the first gate voltage is fixed, if a voltage is not applied to the second gate 116, the sensing transistor 110 may not be turned on, and thus, a current $I_{col}$ may not be detected from the column output line 130.

When a second gate voltage $V_2$ is gradually increased, a current $I_{col}$ may not be detected from the column output line 130 until the sensing transistor 110 is turned on, and the second voltage $V_2$ reaches a first voltage V2_th. According to example embodiments, then the sensing transistor 110 may be turned on, and the detection of the current $I_{col}$ may begin, and the current $I_{col}$ may continuously increase with the second voltage $V_2$. As the first gate voltage becomes lower, the first voltage V2_th may become greater. From the relationship between the first voltage V2_th and the first gate voltage, the first gate voltage may be determined, and thus, the optical intensity in the stage I of FIG. 3 may be measured. Thus, the dynamic range of the image sensor 100 having the sensing transistor 110 may be increased.

Figure 5:
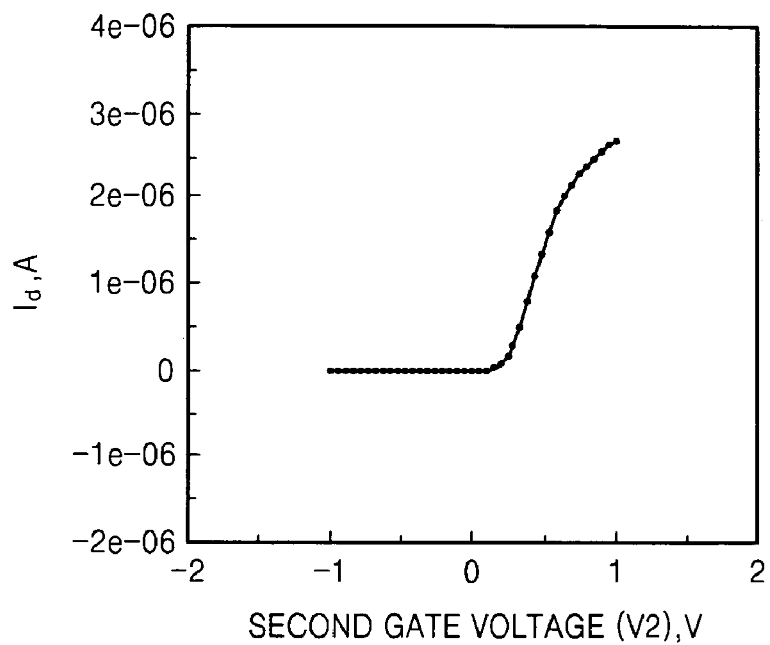
FIG. 5 is a graph showing a measurement result of a turn-on voltage of a sensing transistor of an image sensor according to example embodiments.

FIG. 5 is a graph showing an example of a measurement result of a turn-on voltage of the sensing transistor 110 of the image sensor 100 according to example embodiments.

In the example depicted in FIG. 5, in the sensing transistor 110 in which the first gate 115 and the second gate 116 may have a width of 22 nm, respectively, and a width between the first gate 115 and the second gate 116 may be 10 nm, the first gate voltage may be fixed as 0.075V. As a control voltage $V_2$ applied to the second gate 116 is increased, the sensing transistor 110 may be turned on at a control voltage of approximately 0.2V. FIG. 5 shows an example of the turn-on voltage of the sensing transistor 110 having two gates when the control voltage $V_2$ is applied to the second gate 116 while the first gate voltage is fixed.

Figure 6:
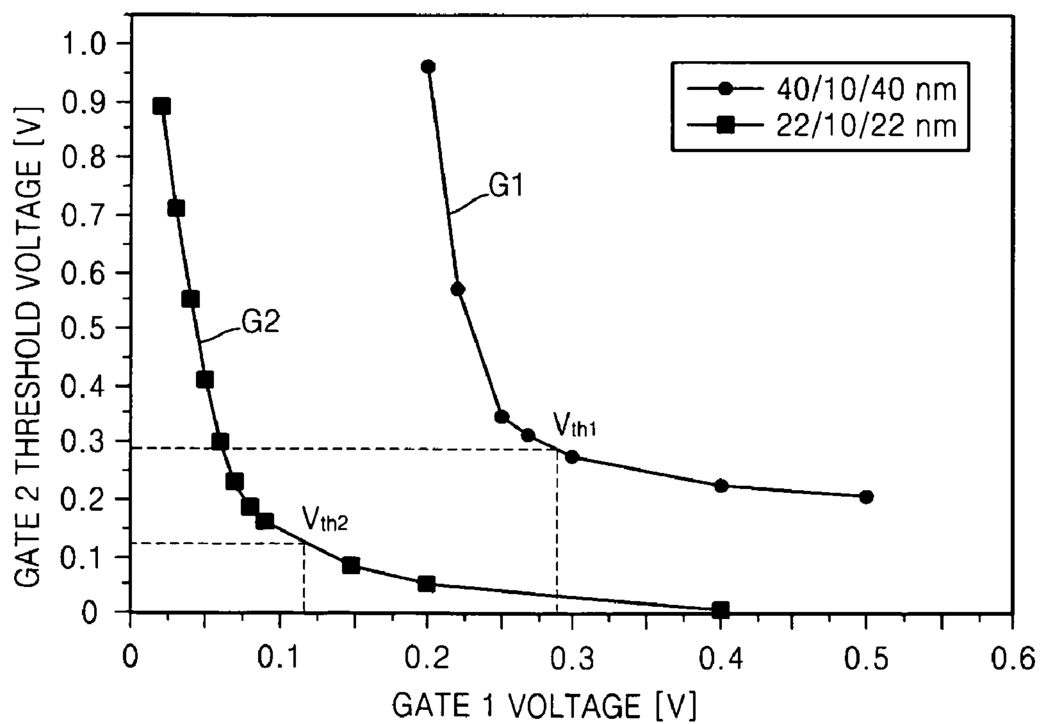
FIG. 6 is a graph showing a relationship between a first gate voltage and a second gate voltage.

FIG. 6 shows an example of a relationship between the first gate voltage and the second gate voltage.

Referring to the example depicted in FIG. 6, a characteristic curve G1 of a first sensing transistor in which the first gate 115 and the second gate 116 respectively have widths of 40 nm and a width between the first gate 115 and the second gate 116 is 10 nm, and a characteristic curve G2 of a second sensing transistor in which the first gate 115 and the second gate 116 respectively have widths of 22 nm and a width between the first gate 115 and the second gate 116 is 10 nm are separately shown.

In the characteristic curve G1, a threshold voltage $V_{th1}$ of the first sensing transistor is identical to the first gate voltage $V_1$ and the second turn-on voltage $V_2$, and is approximately 0.29V.

In the characteristic curve G2, a threshold voltage $V_{th2}$ of the second sensing transistor is identical to the first gate voltage $V_1$ and the second turn-on voltage $V_2$, and is approximately 0.12V.

As the example in FIG. 6 illustrates, in both the first and second sensing transistors, the turn-on voltage of the second gate 116 may increase as the voltage of the first gate 115 is reduced. Accordingly, at an unknown first gate voltage, if the sensing transistor 110 is turned on, then the turn-on voltage of the second gate 116 may be known, and the first gate voltage may be determined by reviewing the characteristic curve of FIG. 6.

The graph of FIG. 6 may be changed according to physical characteristics, for example size of the sensing transistor 110, and thus, the characteristic graph of the sensing transistor 110 may be prepared in advance. The graph of FIG. 6 may be used as a look-up table.

A method of operating the image sensor 100 according to example embodiments will now be described in detail with reference to drawings.

First, a potential of the floating diffusion region FD may be reset to an external voltage $V_{dd}$ by turning on the reset transistor $R_x$.

When light is irradiated onto the photodiode PD, electron-hole pairs may be formed in the photodiode PD, and electrons of the electron-hole pairs may move to the floating diffusion region FD and may be stored in the floating diffusion region FD. A voltage of the first gate 115, which may be connected to the floating diffusion region FD, may be reduced according to the amount of charges accumulated in the floating diffusion region FD.

Next, one row of a pixel array may be selected by turning on the row selection transistor $S_x$.

A column current $I_{col}$ may be measured from the column output line 130 while a control voltage, which may be applied to the second gate 116 from the control voltage source 120, may be gradually increased. If the column current $I_{col}$ is greater than a predetermined reference current, the sensing transistor 110 may be regarded as turned on, and a second voltage applied to the second gate 116, for example at the time the sensing transistor 110 turns on, may be determined. The reference current may be current, for example a minimum current, at which the sensing transistor is regarded as being turned on taking into consideration noise at the column current $I_{col}$.

Next, a first gate voltage may be determined from the second voltage by referring to the characteristic curve, for example a curve depicted in FIG. 6, of the sensing transistor 110 or a look-up table, which may be which may be prepared in advance. The intensity of light irradiated onto the photodiode PD may be calculated from the first gate voltage.

A method of operating the image sensor 100 according to example embodiments will now be described with reference to drawings.

First, a potential of the floating diffusion region FD may be reset to an external voltage $V_{dd}$ by turning on the reset transistor $R_x$.

When light is irradiated onto the photodiode PD, electron-hole pairs may be formed in the photodiode PD, and electrons of the electron-hole pairs may move to the floating diffusion region FD and may be stored in the floating diffusion region FD. A voltage of the first gate 115 connected to the floating diffusion region FD may be reduced according to the amount of charges accumulated in the floating diffusion region FD.

A predetermined voltage, for example, the threshold voltage of the sensing transistor 110 may be applied to the second gate 116 from the control voltage source 120. One row of a pixel array may be selected by turning on the row selection transistor $S_x$.

Whether the sensing transistor 110 is turned on or not may be determined.

If the sensing transistor 110 is not turned on, an output voltage may not be measured from the column line. The sensing transistor 110 may be turned on while a control voltage being applied to the second gate 116 from the control voltage source 120 may be gradually increased. If the sensing transistor 110 is turned on, the control voltage applied to the second gate 116 at this point may be determined.

Next, a first gate voltage according to the control voltage may be obtained from a look-up table which may be prepared in advance. The intensity of light irradiated onto the photodiode PD may be measured from the first gate voltage.

The sensing transistor 110 may be determined as being turned on when the output voltage measured from the column output line 130 is greater than a predetermined voltage.

In the process of determining the turn-on of the sensing transistor 110, if the sensing transistor 110 is determined being as turned on, a column current $I_{col}$ may be measured from the column output line 130. A first gate voltage may be calculated from the column current $I_{col}$.

According to example embodiments, the image sensor 100 may have three transistors, however, example embodiments are not limited thereto. For example, according to example embodiments, the operating method described above may be applied to an image sensor having two transistors that do not have the row selection transistor $S_x$ by employing a sensing transistor 110 having two gates.

Figure 7:
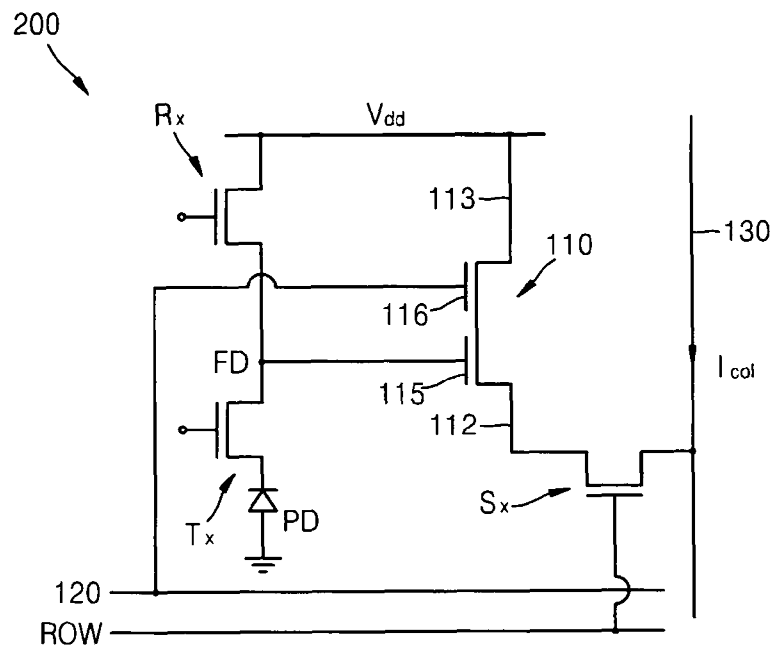
FIG. 7 is an equivalent circuit diagram of an image sensor including a sensing transistor having two gates, according to example embodiments.

FIG. 7 is an equivalent circuit diagram of an image sensor 200 which may include a sensing transistor 110 which may have two gates according to example embodiments. Like reference numerals are used to indicate elements which may be substantially identical to the elements of FIG. 2.

Referring to FIG. 7, the image sensor 200 may further include a transfer transistor $T_x$ between the photodiode PD and the floating diffusion region FD compared to the image sensor 100 of FIG. 2, and may thus include four transistors in total.

When the transfer transistor $T_x$ is turned on, charges generated in the photodiode PD may be transferred to the floating diffusion region FD. The operations of other elements of the image sensor 200 may be substantially the same as those of the image sensor 100 of FIG. 2, and thus, the detailed description thereof will not be repeated.

Figure 8:
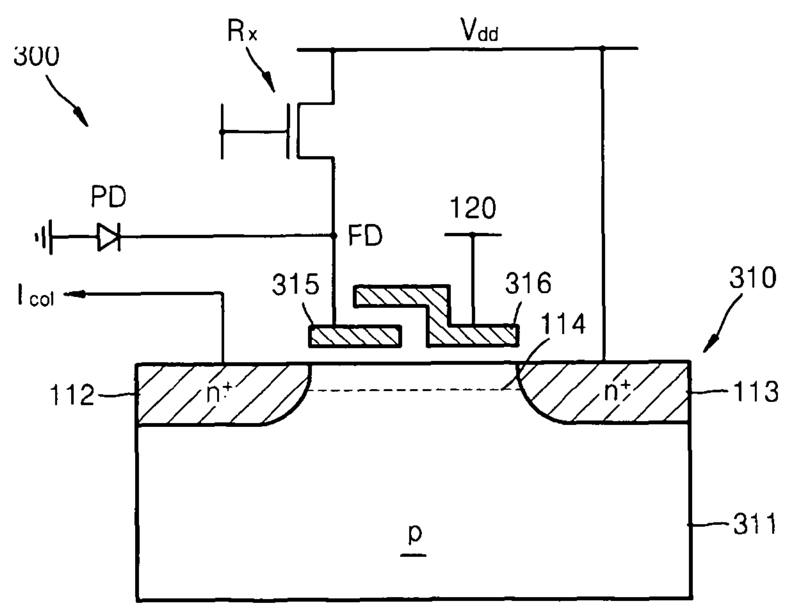
FIG. 8 is a schematic cross-sectional view of an image sensor including a sensing transistor having two gates, according to example embodiments.

FIG. 8 is a schematic cross-sectional view of an image sensor 300 which may include a sensing transistor 310 having two gates, according to example embodiments. Like reference numerals are used to indicate elements which may be substantially identical to the elements of FIG. 1.

Referring to FIG. 8, when the image sensor 300 is compared to the image sensor 100 of FIG. 1, portions of two gates 315 and 316 may be coupled to each other. A portion of the second gate 316 may overlap with a portion of the first gate 315 by extending over the first gate 315. The sensing transistor 310, which may have the coupled gates 315 and 316, may be turned on at a control voltage lower than the sensing transistor 110 of FIG. 1 when the control voltage is applied to the second gate 316. The operations of other elements of the image sensor 300 may be substantially the same as the image sensor 100 of FIG. 1, and thus, the detailed description thereof will not be repeated.

Figure 9:
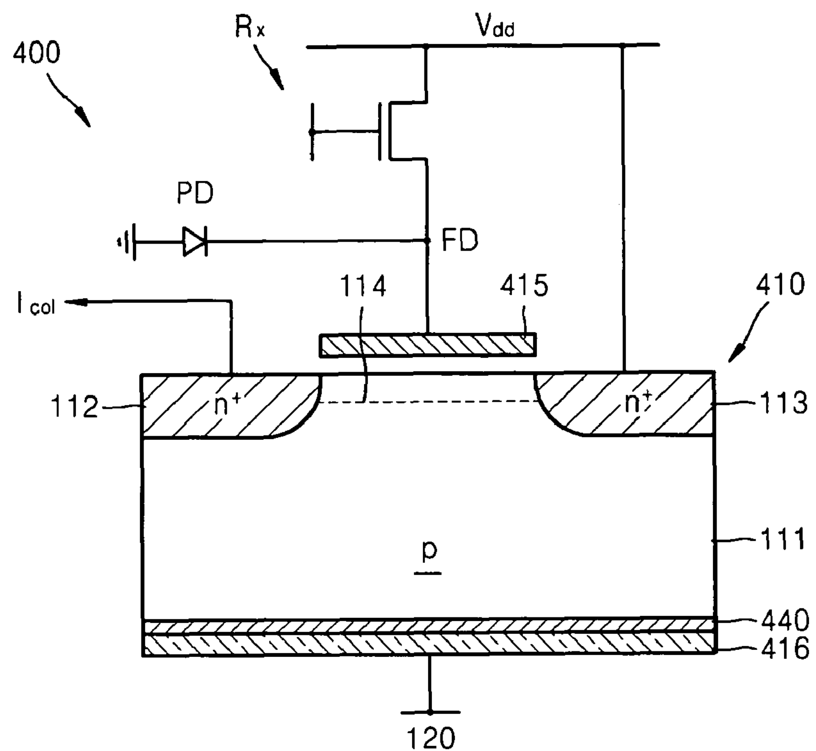
FIG. 9 is a schematic cross-sectional view of an image sensor including a sensing transistor having two gates according to example embodiments.

FIG. 9 is a schematic cross-sectional view of an image sensor 400 which may include a sensing transistor having two gates according to example embodiments. Like reference numerals are used to indicate elements which may be substantially identical to the elements of FIG. 1.

Referring to FIG. 9, the image sensor 400 may include two gates 415 and 416 respectively installed on and under the transistor channel 114 which may be unlike the image sensor 100 of FIG. 1. An insulating layer 440 may be formed between the second gate 416 and the p-type semiconductor substrate 111. The operation of the image sensor 400 may be substantially the same as the operation of the image sensor 100 of FIG. 1, and thus, the description thereof will not be repeated.

Figure 10:
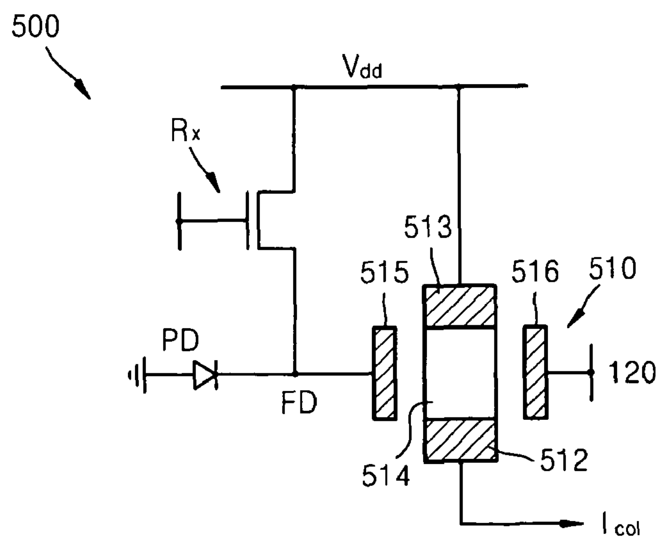
FIG. 10 is a schematic cross-sectional view of an image sensor including a sensing transistor having two gates according to example embodiments.

FIG. 10 is a schematic cross-sectional view of an image sensor 500 which may include a sensing transistor 510 having two gates according to example embodiments. Like reference numerals are used to indicate elements which may be substantially identical to the elements of FIG. 1, and the description thereof will not be repeated.

Referring to FIG. 10, the image sensor 500 may include two gates 515 and 516 respectively vertically installed on both sides of a transistor channel 514 which may be unlike the image sensor 100 of FIG. 1. A source 512, a drain 513, and the transistor channel 514 may be vertically formed on a substrate (not shown).

Also, the operation of the image sensor 500 may be substantially the same as the operation of the image sensor 100 of FIG. 1, and thus, the description thereof will not be repeated.

An image sensor according to example embodiments may realize a correct image since the image sensor may display a wide dynamic range even though light incident to a pixel may be strong.

In a method of operating the image sensor according to example embodiments, a wide dynamic range may be effectively realized using the image sensor.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of operating an image sensor having a photoelectric conversion device and a sensing transistor including a first gate, a second gate, and a floating diffusion region that is connected to the first gate and stores charges generated from the photoelectric conversion device, the method comprising:

resetting a potential of the floating diffusion region;

irradiating light onto the photoelectric conversion device;

applying a control voltage to the second gate;

calculating a first gate voltage;

calculating the intensity of light irradiated onto the photoelectric conversion device based on the first gate voltage;

determining whether the sensing transistor is turned on or not; and if the sensing transistor is not turned on, gradually increasing the control voltage being applied to the second gate, and measuring a second voltage, the second voltage being a value of the control voltage supplied to the second gate when the sensing transistor is turned on.

2. The method of claim 1, wherein the first gate and the second gate are spaced apart on a transistor channel.

3. The image sensor of claim 1, wherein a portion of the first gate is coupled with a portion of the second gate interposing a dielectric layer between the first and second gates.

4. The image sensor of claim 1, wherein the first gate and the second gate are disposed on both sides of the transistor channel to face each other.

5. The image sensor of claim 4, wherein the first gate and the second gate are vertically disposed.

6. The method of claim 1, wherein the determining of whether the sensing transistor is turned on or not comprises determining whether an output current measured from a column output line is greater than a reference current or not, and if the output current is greater than the reference current, calculating the first gate voltage using the output current, the column output line being connected to a source of the sensing transistor.

7. The method of claim 1, wherein the calculating of the first gate voltage comprises obtaining the first gate voltage according to the second voltage by referring to a look-up table.

8. A method of operating an image sensor having a photoelectric conversion device and a sensing transistor including a first gate, a second gate, and a floating diffusion region that is connected to the first gate and stores charges generated from the photoelectric conversion device, the method comprising:

resetting a potential of the floating diffusion region;

irradiating light onto the photoelectric conversion device;

applying a control voltage to the second gate;

calculating a first gate voltage;

calculating the intensity of light irradiated onto the photoelectric conversion device based on the first gate voltage;

gradually increasing the control voltage being applied to the second gate; and determining a first voltage, the first voltage being a value of the control voltage supplied to the second gate when the sensing transistor is turned on, wherein the calculating of the first gate voltage comprises obtaining the first gate voltage according to the first voltage by referring to a look-up table.

9. A method of operating an image sensor having a photoelectric conversion device and a sensing transistor including a first gate, a second gate, and a floating diffusion region that is connected to the first gate and stores charges generated from the photoelectric conversion device, the method comprising:

resetting a potential of the floating diffusion region;

irradiating light onto the photoelectric conversion device;

applying a control voltage to the second gate;

calculating a first gate voltage;

calculating the intensity of light irradiated onto the photoelectric conversion device based on the first gate voltage;

gradually increasing the control voltage being applied to the second gate; and determining a first voltage, the first voltage being a value of the control voltage supplied to the second gate when the sensing transistor is turned on, wherein the determining of the first voltage comprises determining the sensing transistor is turned on when a column current measured from a column output line is greater than a reference current, the column output line being connected to a source of the sensing transistor.

* * * * *